United States Patent
Li et al.

(10) Patent No.: US 11,088,293 B2
(45) Date of Patent: Aug. 10, 2021

(54) METHODS AND APPARATUS FOR PRODUCING COPPER-INDIUM-GALLIUM-SELENIUM (CIGS) FILM

(71) Applicant: APPLIED MATERIALS, INC., Santa Clara, CA (US)

(72) Inventors: Philip Hsin-Hua Li, Danville, CA (US); Seshadri Ramaswami, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/442,776

(22) Filed: Jun. 17, 2019

(65) Prior Publication Data

US 2020/0006581 A1 Jan. 2, 2020

Related U.S. Application Data

(60) Provisional application No. 62/691,079, filed on Jun. 28, 2018.

(51) Int. Cl.
  *H01L 31/032* (2006.01)
  *H01L 31/18* (2006.01)
  *H01L 27/146* (2006.01)

(52) U.S. Cl.
  CPC .... *H01L 31/0323* (2013.01); *H01L 27/14649* (2013.01); *H01L 31/18* (2013.01)

(58) Field of Classification Search
  CPC ........... H01L 31/0323; H01L 31/03923; H01L 31/03928; H01L 2924/10821
  USPC .......... 257/443; 438/48, 66, 67, 73, 80, 982
  See application file for complete search history.

(56) References Cited

U.S. PATENT DOCUMENTS

| | | | |
|---|---|---|---|
| 8,436,455 B2 | 5/2013 | Wieting | |
| 8,629,916 B2 | 1/2014 | Tanaka | |
| 9,496,433 B2 | 11/2016 | Maekawa et al. | |
| 2009/0320916 A1* | 12/2009 | Yuan ................... | H01L 31/1852 136/256 |

(Continued)

OTHER PUBLICATIONS

Improved Energy Conversion Efficiency in Wide-Bandgap Cu(In,Ga)Se2 Solar Cells, Preprint, Miguel Contreras. Lorelle Mansfield. Brian Egaas, Jian Li, Manuel Romero, and Rommel Noufi, National Renewable Energy Laboratory, Eveline Rudiger-Voigt and Wolfgang Mannstadt, Schott AG, Presented at the 37th IEEE Photovoltaic Specialists Conference (PVSC 37), Seattle, Washington, Jun. 19-24, 2011,pp. 1-8.

(Continued)

*Primary Examiner* — Didarul A Mazumder
(74) *Attorney, Agent, or Firm* — Moser Taboada

(57) ABSTRACT

Methods and apparatus form a photon absorber layer of a photodiode with characteristics conducive to applications such as, but not limited to, image sensors and the like. The absorber layer uses a copper-indium-gallium-selenium (CIGS) material with a gallium mole fraction of approximately 35% to approximately 70% to control the absorbed wavelengths while reducing dark current. Deposition temperatures of the absorber layer are controlled to less than approximately 400 degrees Celsius to produce sub-micron grain sizes. The absorber layer is doped with antimony at a temperature of less than approximately 400 degrees Celsius to increase the absorption.

20 Claims, 4 Drawing Sheets

(56) References Cited

U.S. PATENT DOCUMENTS

| | | | |
|---|---|---|---|
| 2011/0205412 A1 | 8/2011 | Miyazaki et al. | |
| 2011/0215281 A1* | 9/2011 | Chen | H01B 1/02 |
| | | | 252/519.4 |
| 2012/0031492 A1 | 2/2012 | Sevvana et al. | |
| 2012/0067407 A1* | 3/2012 | Fujdala | H01L 31/03923 |
| | | | 136/252 |
| 2012/0214293 A1* | 8/2012 | Aksu | C25D 7/126 |
| | | | 438/478 |
| 2013/0316519 A1* | 11/2013 | Mitzi | H01L 21/02557 |
| | | | 438/478 |
| 2014/0291147 A1* | 10/2014 | Li | H01L 31/0749 |
| | | | 204/298.13 |
| 2015/0263198 A1* | 9/2015 | Chen | H01L 31/0322 |
| | | | 136/262 |
| 2016/0365471 A1* | 12/2016 | Mansfield | H01L 21/02631 |

OTHER PUBLICATIONS

Structural and Electric Characteristics of Cu(In, Ga) Se2 Thin Films Sputtered From Quaternary Targets, https://www.researchgate.net/publication/261086273, Conference Paper in Conference Record of the IEEE Photovoitaic Specialists Conference • Jun. 2012 DOI: 10.1109/PVSC.2012.6318236. 1-5.

Antimony assisted low-temperature processing of CuIn1—xGaxSe2—ySy solar cells, Min Yuan a, David B. Mitzi a, Oki Gunawan a, Andrew J. Kellock b, S. Jay Chey a. Vaughn R. Deline b, a IBM T. J. Watson Research Center. P. O. Box 218, Yorktown Heights, NY 10598, USA. b IBM Almaden Research Center. 650 Harry Rd. San Jose, CA 95120, USA, journal homepage: www.elsevi e r.com/locate/tsf, pp. 852-856.

Properties of Ga2O3/Ga2O3:Sn/CIGS for visible light sensors, K Kikuchi1, S Imura, K Miyakawa, H Ohtake, M Kubota, NHK Science and Technology Research Laboratories Jan. 10, 2011, Kinuta, Setagaya-ku. Tokyo, 157-8510, Japan, E-mail: kikuchi.k-oa@nhk.or.jp, Journal of Physics: Conference Series 619 (2015) Jan. 2009, pp. 1-5.

Defectgerelateerde verschijnselen, in chalcopyrietgebaseerde zonnecellen, Defect Related Phenomena in Chalcopyrite Based Solar Cells, Koen Decock. Promotor: prof. dr. ir. M. Burgelman, Proefschrift ingediend tot het behalen van de greed van. Doctor in de Ingenieurswetenschappen: Toegepaste Natuurkunde, Vakgroep Elektronica en Informatiesystemen, Voorzitter: prof. dr. ir. J. Van Campenhout, Faculteit Ingenieurswetenschappen en Architectuur, Academiejaar 2011-2012, pp. 1-174.

Andor an Oxford Instruments company, Low Dark Current Deep-Depletion (LDC-DD) Technology, A new standard for low-fight NIR Spectroscopy. Green, M.A. and Keevers, M. "Optical properties of intrinsic silicon at 300 K", Progress in Photovoltaics, p. 189-192, vol. 3, No. 3 (1995), e2v website link: http://www.e2v.com/products-and-services/high-performance-imaging-solutions/imaging-solutions/imaging-solutions-cmosccdemccd/, qe-curves/2. 3. Andor Technology application note, "Optical Etaloning in Charge Coupled Devices (CCDs)" www.andor.com, pp. 1-8.

Proceedings of SPIE, SPIEDigitalLibrary.org/conference-proceedings-of-spie, Band gap engineering of ZnO for high efficiency CIGS based solar cells Charlotte Platzer-Björkman, Adam Hultqvist, Jonas Pettersson and Tobias Törndahl, Uppsala University, Ångström Solar Center, Solid State Electronics, Box 534, SE-751 21 Uppsala, Sweden, Charlotte.platzer@angstrom.uu.se, phone +46-471 3120, fax +46-18-555095, Proc. SPIE 7603, Oxide-based Materials and Devices, 76030F (Feb. 15, 2010): doi: 10.1117/12.846017,pp. 1-10.

* cited by examiner

METHODS AND APPARATUS FOR PRODUCING COPPER-INDIUM-GALLIUM-SELENIUM (CIGS) FILM

CROSS-REFERENCE TO RELATED APPLICATIONS

This application claims benefit of U.S. provisional patent application Ser. No. 62/691,079, filed Jun. 28, 2018 which is herein incorporated by reference in its entirety.

FIELD

Embodiments of the present principles generally relate to semiconductor manufacturing.

BACKGROUND

Photoelectric devices can include photovoltaic cells and photodiodes. Photovoltaic cells or solar cells are semiconductor devices that convert light into energy. The photovoltaic cells operate with a zero or forward bias and are inclusive of all wavelengths that may possess energy. Photodiodes are semiconductor devices that convert light into signals. Photodiodes operate with a negative bias and are typically limited to certain wavelengths. Both photovoltaic and photodiodes include a photon absorbing region to convert light into energy or signals. The photon absorbing region may include material compounds of copper-indium-selenium (CIS) or copper-indium-gallium-selenium (CIGS). While CIS/CIGS compounds have proven useful in photovoltaic cells, the CIS/CIGS compounds have not been satisfactory for use in photodiodes.

Thus, the inventors have provided methods and apparatus for producing CIGS film with complementary photodiode characteristics.

SUMMARY

Methods and apparatus for producing CIGS film for use in image sensor applications.

In some embodiments, a method of forming a film layer on a substrate comprises depositing the film layer using a copper-indium-gallium-selenium (CIGS) material, controlling a deposition temperature to produce sub-micron grain size in the film layer during deposition, and doping the film layer with antimony to increase photon energy absorption of the film layer.

In some embodiments, the method further includes depositing the film layer using a CIGS material with a gallium mole fraction of approximately 35% to approximately 70%; depositing the film layer using a CIGS material with a gallium mole fraction of approximately 57%; controlling the deposition temperature to less than approximately 400 degrees Celsius to produce sub-micron grain size in the film layer during deposition; doping the film layer with antimony at a temperature of less than approximately 400 degrees Celsius; and/or doping the film layer to approximately 1.2 mol % to approximately 5 mol % antimony.

In some embodiments, a method of forming a film layer of a photodiode comprises depositing the film layer using a copper-indium-gallium-selenium (CIGS) material with a gallium mole fraction of approximately 35% to approximately 70%, controlling a deposition temperature to less than approximately 400 degrees Celsius to produce sub-micron grain size in the film layer during deposition, and doping the film layer with antimony at a temperature of less than approximately 400 degrees Celsius.

In some embodiments, the method further comprises depositing the film layer using a CIGS material with a gallium mole fraction of approximately 57%; and/or doping the film layer to approximately 1.2 mol % to approximately 5 mol % antimony.

In some embodiments, an apparatus for detecting images comprises a photodiode with an absorber layer having a copper-indium-gallium-selenium (CIGS) material with a sub-micron grain size.

In some embodiments, the apparatus further comprises wherein the CIGS material has a gallium mole fraction of approximately 35% to approximately 70%; wherein the CIGS material has a gallium mole fraction of approximately 57%; wherein the CIGS material is doped with antimony; wherein the CIGS material is doped with approximately 1.2 mol % to approximately 5 mol % antimony; wherein the absorber layer absorbs wavelengths less than or equal to approximately 940 nm and is transparent to wavelengths greater than approximately 940 nm; and/or wherein the absorber layer has a bandgap of 1.31 eV.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
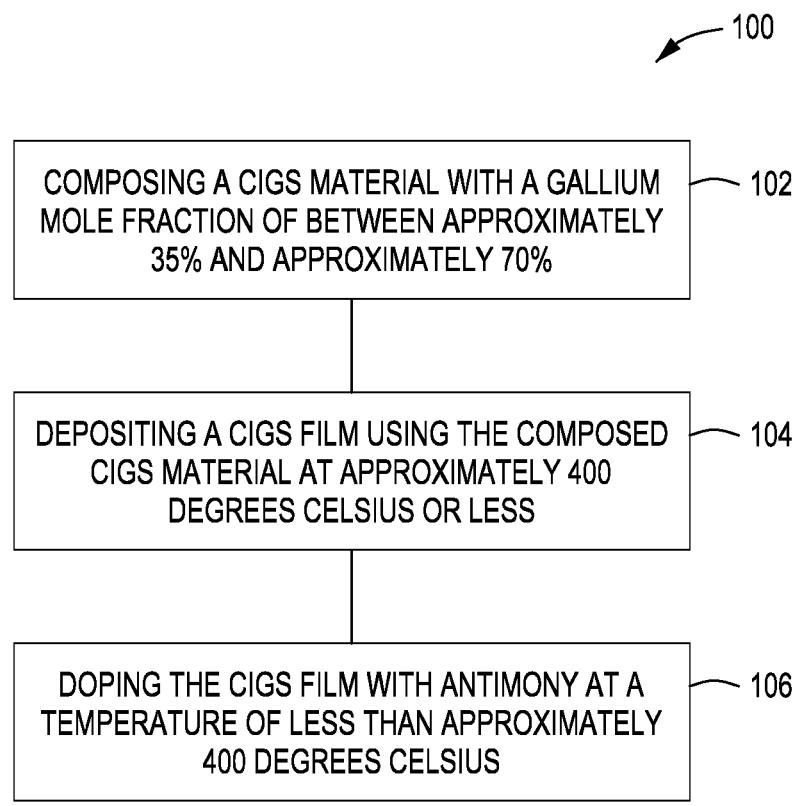
FIG. 1 is a method of producing CIGS film in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus of the present principles provide optimized manufacturing processes that enhance the characteristics of CIGS film to complement photodiode applications such as, but not limited to, image sensor applications. The CIGS film advantageously has increased photon absorption and resolution for use in image sensor applications and the like. The high absorption is obtained through charge carrier modulation by control of the alpha and beta phases of the crystalline states and through external doping of the CIGS film. The resolution is increased by controlling deposition temperatures of the CIGS film to advantageously obtain a sub-micron grain size. The detrimental effects of dark current are controlled by establishing an optimal bandgap wavelength to maximize photo-electron absorption and advantageously minimize the dark current. The bandgap wavelength is established by the gallium mole fraction of the CIGS film. The CIGS film produced by the methods and apparatus of the present principles advantageously provide superior opto-electrical characteristics for use in applications such as, for example, image sensors.

FIG. 1 is a method 100 of producing CIGS film in accordance with some embodiments. In block 102, a CIGS material with a gallium mole fraction from approximately 35% to approximately 70% is composed for depositing a CIGS film on a substrate. A CIGS compound has a material composition relationship of $Cu(In_{1-x} Ga_x)Se_2$. The CIGS composition variations between indium and gallium determines the bandgap of the CIGS compound and the photon absorption properties. In near infrared (NIR) image applications, the wavelength cutoff point defines the bandgap requirement. The inventors have found that to include visible and NIR wavelengths for image sensor applications, the bandgap should be high enough to absorb those wavelengths but should also minimize dark current. The inventors have found that an NIR wavelength of 940 nm with a bandgap of 1.31 eV (electron-volts) has optimal characteristics for image sensor applications. The bandgap, in turn, determines the gallium mole fraction for the CIGS compound. The inventors have found that a gallium mole fraction of approximately 57% will yield a bandgap of approximately 1.31 eV. In some embodiments, the inventors have also found that a gallium mole fraction of approximately 35% to approximately 70% will also provide sufficient photon absorption for image sensor applications.

The bandgap determines how much photon energy is required before the photon will be absorbed. If the photon energy is greater than the bandgap, the photon is absorbed. If the photon energy is less than the bandgap, the photon will pass through and be transparent. Shorter wavelengths have higher energy potential than longer wavelengths. By selecting a bandgap of 1.31 eV, wavelengths greater than 940 nm will pass through and won't be absorbed. Wavelengths less than and equal to 940 nm will be absorbed. Smaller bandgaps with lower mole fractions may be used. The smaller bandgaps will have higher levels of dark current (leakage current). Dark current is current produced even when no light is present and is related to the gallium mole fraction. The dark current creates a background noise level threshold current that a response current (current occurring in response to light) has to overcome before the response current can be detected. Dark current often causes anomalies in image sensor applications such as blinking pixels or white pixels and the like. The inventors have found that CIGS film with a gallium mole fraction of 57% maximizes the photon absorption while minimizing the dark current for image sensor applications.

Figure 2:
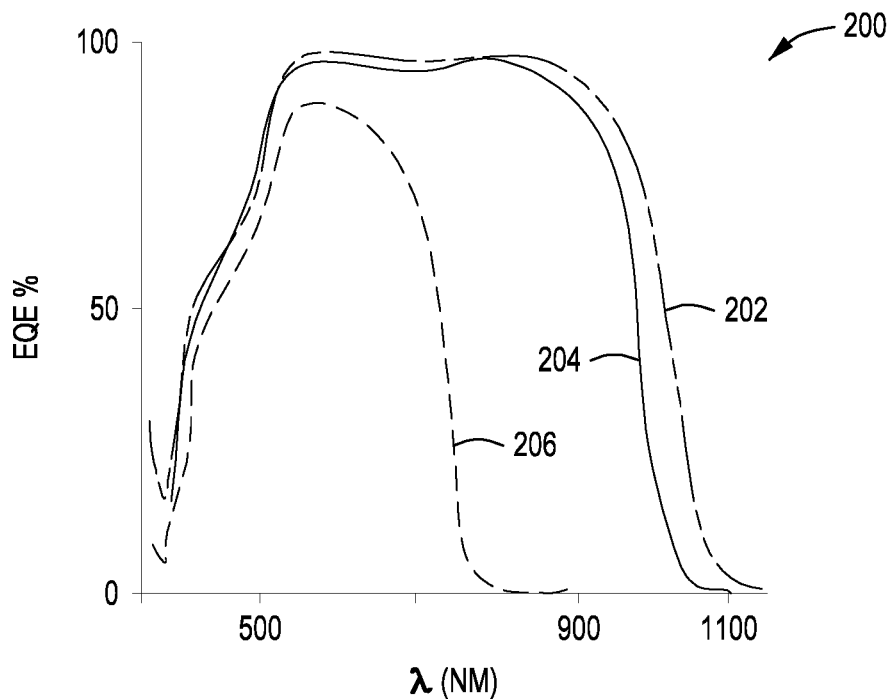
FIG. 2 is a graph illustrating the gallium mole fraction effects on external quantum efficiency in accordance with some embodiments of the present principles.

External quantum efficiency (EQE) is a ratio of a number of charge carriers collected by an opto-electronic device to the number of absorbed photons of energy externally transmitted at the opto-electronic device. FIG. 2 is a graph 200 illustrating the gallium mole fraction effects on external quantum efficiency in accordance with some embodiments. The graph 200 depicts a first curve 202 for a 41% gallium mole fraction, a second curve 204 for a 57% gallium mole fraction, and a third curve 206 for a 100% gallium mole fraction. As the curves 202-206 move downward, the energy that a photon can transmit is cutoff for those wavelengths (λ) outside of the curve. The graph 200 shows that the first curve 202 which has the lowest gallium mole fraction of 41%, the lowest bandgap eV, and the highest photon energy absorption. The third curve 206 has the highest gallium mole fraction of 100%, the greatest bandgap eV, and the lowest photon energy absorption. The inventors have found that if the highest gallium mole fraction (the third curve 206) is used for image sensor applications, photon energy will be absorbed during both light and dark conditions, increasing the background noise or dark current (leakage current). The dark current shows up as unwanted dots or blinking pixels and other artifacts in images captured by an image sensor. The inventors have found that by increasing the bandgap, the captured image will have less artifacts.

Figure 3:
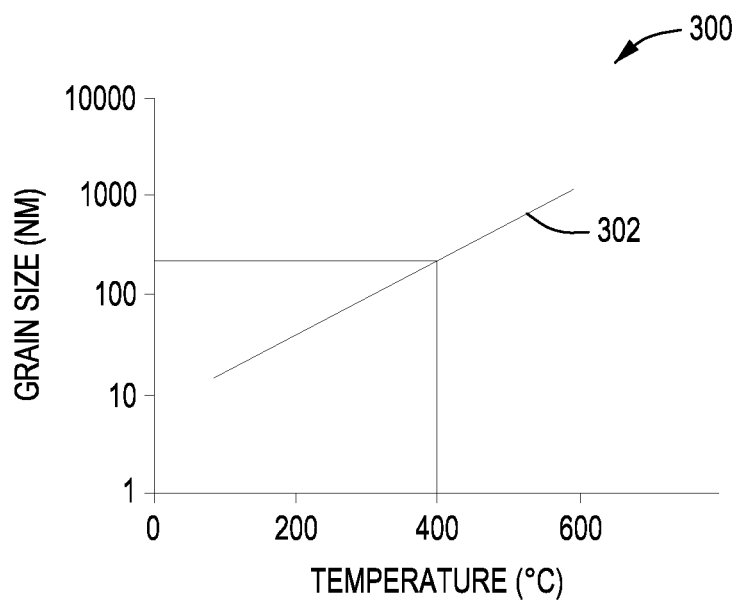
FIG. 3 is a graph illustrating the effects of temperature on CIGS grain size in accordance with some embodiments of the present principles.

A CIGS film may be deposited on a substrate using a quaternary target with an optimized gallium mole fraction that increases absorption while reducing dark current. In block 104 of the method 100 of FIG. 1, the CIGS film is deposited on a substrate using the composed CIGS material as described above at a temperature of approximately 400 degrees Celsius or less. The deposition process is performed at a low deposition temperature to produce sub-micron grain sizes in the CIGS film to increase resolution in image sensor applications and the like. With solar energy, the absorption level increases with increased grain size. The larger the grain size, the higher the absorption. Large grain sizes are obtained by increasing the deposition temperature. Common deposition temperatures for photovoltaic cells may reach as high as 580 degrees Celsius. The inventors have found that for image sensor applications smaller grain sizes yield higher image resolutions. In FIG. 3, a graph 300 is shown that illustrates the effects of deposition temperature on CIGS grain size in accordance with some embodiments. A linear line 302 approximates CIGS grain size versus deposition temperature. At a deposition temperature of less than approximately 400 degrees Celsius, the grain size of the CIGS film will be sub-micron. For image sensor applications, the image sensor resolution is defined by the size of the pixels that capture an image—a smaller grain size allows for more pixels and greater image resolution.

Figure 4:
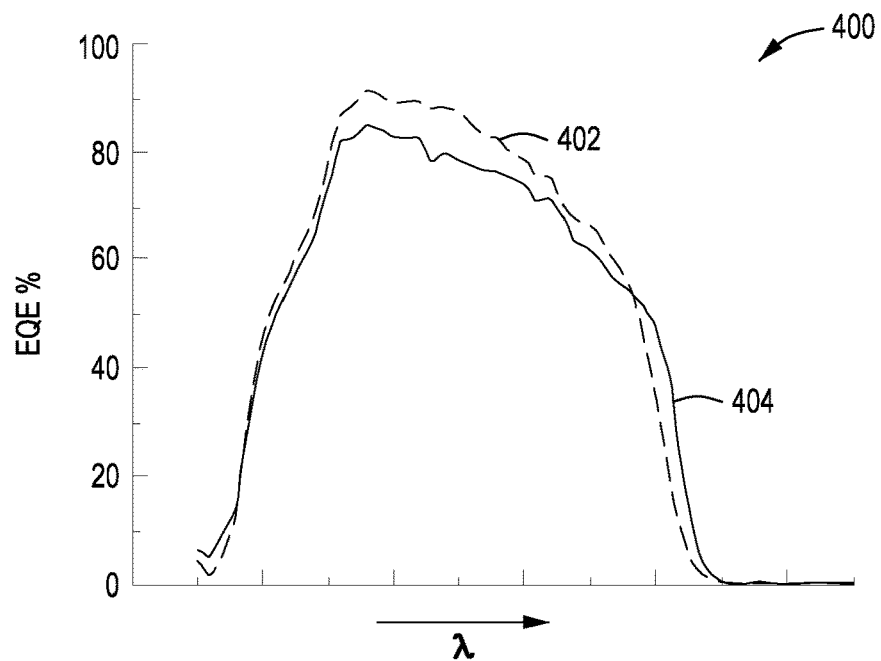
FIG. 4 is a graph illustrating antimony dopant temperature effects on external quantum efficiencies in accordance with some embodiments of the present principles.

In block 106 of FIG. 1, the deposited CIGS film is doped with antimony at a temperature of less than approximately 400 degrees Celsius. The inventors have found that antimony can be used as a dopant at low temperatures to enhance the absorption of the CIGS film by increasing the charge carrier density. A high absorption may be obtained by charge carrier modulation. The charge carriers are modulated through the alpha and beta phases of the crystalline states of the CIGS film and the external antimony doping. In some embodiments, the antimony doping is from approximately 1.2 mol % to approximately 5 mol %. The alpha and beta phases occur as a crystalline structure is grown, and the antimony doping further enhances the charge carrier condition. The inventors have found that antimony allows for a low temperature doping with minimal external quantum efficiency change as the temperature is decreased. FIG. 4 is a graph 400 illustrating antimony dopant temperature effects on external quantum efficiencies in accordance with some embodiments. The first curve 402 is for a high temperature antimony doping process (approximately 540 degrees Celsius). The second curve 404 is for a low temperature antimony doping process (approximately 400 degrees Celsius). As can be seen from the graph 400, the overall differences between the external quantum efficiency of the first curve 402 and the second curve 404 are relatively small.

The small EQE change over a large temperature change allows antimony doping to be accomplished at lower temperatures without greatly impacting the performance of the antimony doping. The mol % antimony doping can be increased at lower temperatures to maintain the performance.

The inventors have found that a CIGS film produced with high absorption, sub-micron grain size, and an optimal bandgap wavelength is highly complementary to photodiode applications such as image sensors. The CIGS film will increase image sensor resolution while minimizing artifacts in an image. The inventors have also found that the lower temperature of the CIGS film process allows for greater flexibility in semiconductor manufacturing and reduced impact on semiconductor thermal budgets.

Figure 5:
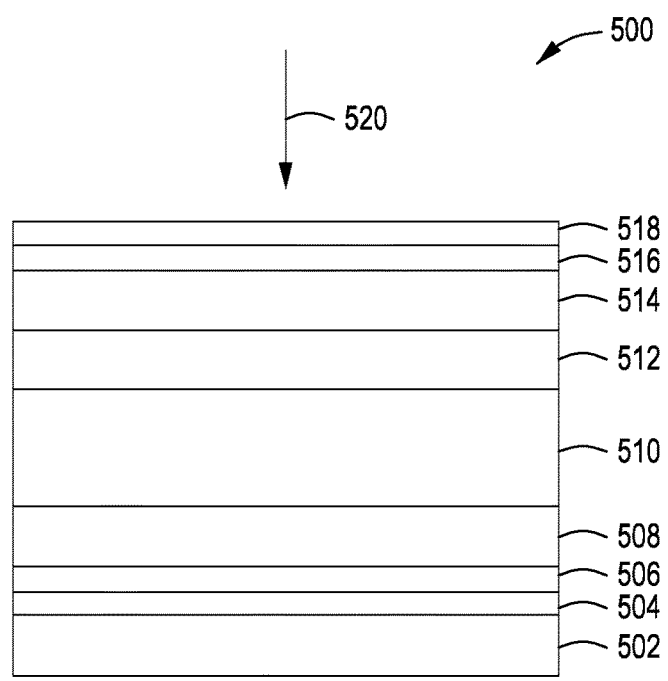
FIG. 5 depicts a photodiode stack in accordance with some embodiments of the present principles.

Methods and apparatus of the present principles may be used in the manufacturing of photodiodes. FIG. 5 depicts a photodiode stack 500 in accordance with some embodiments. The photodiode stack 500 includes a substrate 502 (e.g., silicon and the like) with a silicon dioxide layer 504. A bottom contact of the photodiode stack 500 may include a titanium nitride layer 506 and a molybdenum layer 508. A p-type absorption layer of the photodiode stack 500 may include a CIGS film layer 510. The methods and apparatus of the present principles may be incorporated as the absorption layer (the CIGS film layer 510) in the photodiode stack 500. An n-type layer 512 of the photodiode stack 500 may include a $Ga_2O_3$:Sn layer or Zn(O,S) layer. A hole blocker layer 514 to inhibit dark current of the photodiode stack 500 may include a $Ga_2O_3$ layer or ZnO layer. A top contact layer of the photodiode stack 500 may include an indium-tin-oxide layer 516. An antireflection coating layer of the photodiode stack 500 may include a silicon dioxide layer 518. Light 520 enters the top of the photodiode stack 500 and photo-carriers are absorbed in the CIGS absorber layer. Electrons are collected at the top contact layer and the holes are collected at the bottom contact layer. The CIGS film layer of the present principles reduces the dark current and increases the resolution of the photodiode stack 500.

Figure 6:
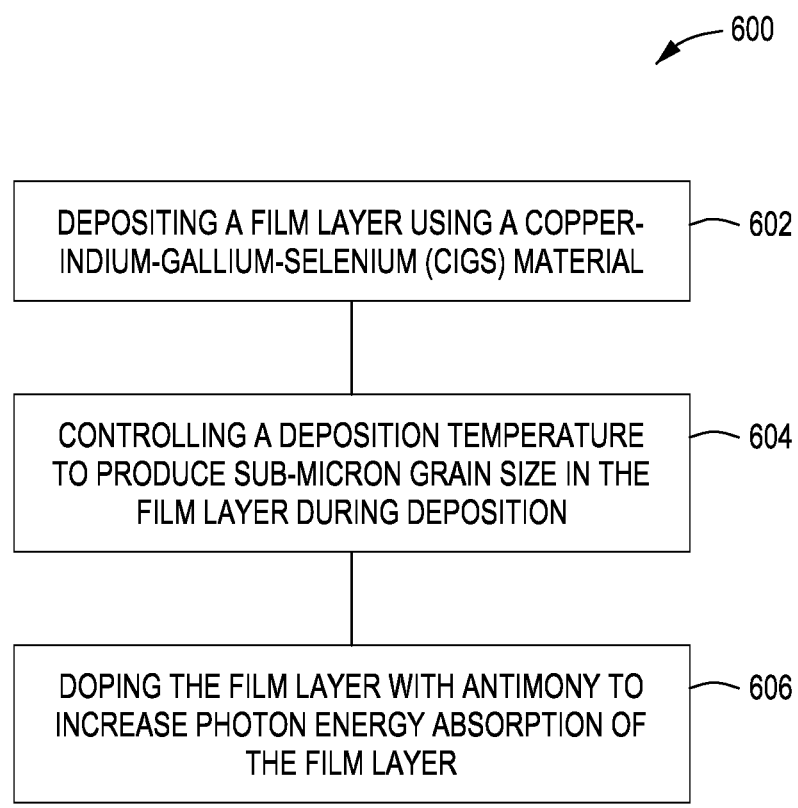
FIG. 6 is another method of producing CIGS film in accordance with some embodiments of the present principles.

FIG. 6 is another method 600 of producing CIGS film in accordance with some embodiments. In block 602, a CIGS material is deposited on a substrate to form a film layer. The CIGS may material may come from a compound that has a material composition relationship of $Cu(In_{1-x} Ga_x)Se_2$. The CIGS composition variations between indium and gallium determines the bandgap of the CIGS compound and the photon absorption properties as described above for FIG. 1. The inventors have found that a gallium mole fraction of approximately 57% will yield a bandgap of approximately 1.31 eV. In some embodiments, the inventors have also found that a gallium mole fraction of approximately 35% to approximately 70% will also provide sufficient photon absorption for image sensor applications.

A CIGS film may be deposited on a substrate using a quaternary target with an optimized gallium mole fraction that increases absorption while reducing dark current. In block 604 of the method 600 of FIG. 6, the CIGS film is deposited on a substrate using the composed CIGS material as described above while controlling the deposition temperature to produce sub-micron grain size in the film layer during deposition. In some embodiments, the temperature may be approximately 400 degrees Celsius or less. The low temperature deposition process produces sub-micron grain sizes in the CIGS film to increase resolution in image sensor applications and the like. For image sensor applications, the image sensor resolution is defined by the size of the pixels that capture an image—a smaller grain size allows for more pixels and greater image resolution.

In block 606 of FIG. 6, the deposited CIGS film layer is doped with antimony to increase photon energy absorption of the film layer. As discussed above for FIG. 1, the inventors have found that antimony can be used as a dopant at low temperatures to enhance the absorption of the CIGS film by increasing the charge carrier density. A high absorption may be obtained by charge carrier modulation. The charge carriers are modulated through the alpha and beta phases of the crystalline states of the CIGS film and the external antimony doping. In some embodiments, the antimony doping is from approximately 1.2 mol % to approximately 5 mol %. The alpha and beta phases occur as a crystalline structure is grown, and the antimony doping further enhances the charge carrier condition. The inventors have found that antimony allows for a low temperature doping with minimal external quantum efficiency change as the temperature is decreased.

As discussed above, the inventors have found that a CIGS film produced with high absorption, sub-micron grain size, and an optimal bandgap wavelength is highly complementary to photodiode applications such as image sensors. The CIGS film will increase image sensor resolution while minimizing artifacts in an image. The inventors have also found that the lower temperature of the CIGS film process allows for greater flexibility in semiconductor manufacturing and reduced impact on semiconductor thermal budgets.

While the foregoing is directed to embodiments of the present principles, other and further embodiments of the principles may be devised without departing from the basic scope thereof.

The invention claimed is:

1. A method of forming a film layer on a substrate, comprising:
    depositing the film layer using a copper-indium-gallium-selenium (CIGS) material;
    controlling a deposition temperature to produce sub-micron grain size in the film layer during deposition; and
    doping the film layer after deposition with antimony to increase photon energy absorption of the film layer.

2. The method of claim 1, further comprising:
    depositing the film layer using the CIGS material with a gallium mole fraction of 35% to 70%.

3. The method of claim 1, further comprising:
    depositing the film layer using the CIGS material with a gallium mole fraction of 57%.

4. The method of claim 3, further comprising
    controlling the deposition temperature to less than 400 degrees Celsius to produce sub-micron grain size in the film layer during deposition.

5. The method of claim 4, further comprising:
    doping the film layer with antimony at a temperature of less than 400 degrees Celsius.

6. The method of claim 1, further comprising:
    controlling the deposition temperature to less than 400 degrees Celsius to produce sub-micron grain size in the film layer during deposition.

7. The method of claim 1, further comprising:
    doping the film layer to 1.2 mol % to 5 mol % antimony.

8. The method of claim 1, further comprising:
    doping the film layer with antimony at a temperature of less than 400 degrees Celsius.

9. A method of forming a film layer of a photodiode, comprising:

depositing the film layer using a copper-indium-gallium-selenium (CIGS) material with a gallium mole fraction of 35% to 70%;

controlling a deposition temperature to less than 400 degrees Celsius to produce sub-micron grain size in the film layer during deposition; and doping the film layer after deposition with antimony at a temperature of less than 400 degrees Celsius.

10. The method of claim 9, further comprising:
depositing the film layer using the CIGS material with a gallium mole fraction of 57%.

11. The method of claim 9, further comprising:
doping the film layer to 1.2 mol % to 5 mol % antimony.

12. An apparatus for detecting images, comprising:
a photodiode with an absorber layer having a copper-indium-gallium-selenium (CIGS) material with a sub-micron grain size.

13. The apparatus of claim 12, wherein the CIGS material has a gallium mole fraction of 35% to 70%.

14. The apparatus of claim 12, wherein the CIGS material has a gallium mole fraction of 57%.

15. The apparatus of claim 14, wherein the CIGS material is doped with antimony.

16. The apparatus of claim 15, wherein the CIGS material is doped with 1.2 mol % to 5 mol % antimony.

17. The apparatus of claim 12, wherein the CIGS material is doped with antimony.

18. The apparatus of claim 17, wherein the CIGS material is doped with 1.2 mol % to 5 mol % antimony.

19. The apparatus of claim 12, wherein the absorber layer absorbs wavelengths less than or equal to 940 nm and is transparent to wavelengths greater than 940 nm.

20. The apparatus of claim 12, wherein the absorber layer has a bandgap of a 1.31 eV.

* * * * *